United States Patent [19]
Kagimasa et al.

[11] Patent Number: 5,363,502
[45] Date of Patent: Nov. 8, 1994

[54] HOT STAND-BY METHOD AND COMPUTER SYSTEM FOR IMPLEMENTING HOT STAND-BY METHOD

[75] Inventors: Toyohiko Kagimasa, Hachioji; Osamu Chinone, Tokyo; Shigeo Yonenaga, Yokohama, all of Japan

[73] Assignee: Hitachi, Ltd., Tokyo, Japan

[21] Appl. No.: 712,685

[22] Filed: Jun. 10, 1991

[30] Foreign Application Priority Data

Jun. 8, 1990 [JP] Japan .................................. 2-150173

[51] Int. Cl.$^5$ ............................................. G06F 11/00
[52] U.S. Cl. .................................. 395/575; 371/10.1; 371/11.1; 371/21.1
[58] Field of Search ...................... 371/10.1, 10.2, 12, 371/13, 15.1, 68.3, 21.1; 395/575, 164, 165, 425; 364/245, 187

[56] References Cited

U.S. PATENT DOCUMENTS

| | | | |
|---|---|---|---|
| 4,562,528 | 12/1985 | Baba | 364/187 |
| 4,841,439 | 6/1989 | Nishikawa et al. | 371/13 |
| 4,890,284 | 12/1989 | Murphy et al. | 364/187 |
| 4,930,128 | 5/1990 | Suzuki et al. | 371/12 |
| 5,159,671 | 10/1992 | Iwami | 371/10.1 |
| 5,175,847 | 12/1992 | Mellot | 395/575 |
| 5,200,959 | 4/1993 | Gross et al. | 371/21.6 |
| 5,202,887 | 4/1993 | Ueno et al. | 371/10.1 |

FOREIGN PATENT DOCUMENTS 57-111900  7/1982  Japan .......................... G06F 11/16

OTHER PUBLICATIONS

Siewiorek D. P. "Architecture of Fault-Tolerant Computers" IEEE Computer, vol. 17, No. 8, Aug. 1984 pp. 9–17.

*Primary Examiner*—Robert W. Beausoliel, Jr.
*Assistant Examiner*—Alber T. Decady
*Attorney, Agent, or Firm*—Antonelli, Terry, Stout & Kraus

[57] ABSTRACT

The computer system provides a processing unit and normal-use and stand-by main storage units, pre-loads an application program and a control program required for executing the application program in both of the main storage units, in a normal operating time, functions the normal-use main storage unit only as the main storage under the control of the processing unit, executes the control program and the application program stored in the normal-use main storage unit, in a software-fault occurring time, functions the stand-by main storage unit only as the main storage unit under the control of the processing unit, and executes the control program and the application program stored in the stand-by main storage unit. Then, a recovery program contained in the application program stored in the stand-by main storage unit serves to recover the state of the application program into the state before fault occurs. Next, the application program is kept being executed or re-started from the head of the application program.

17 Claims, 7 Drawing Sheets

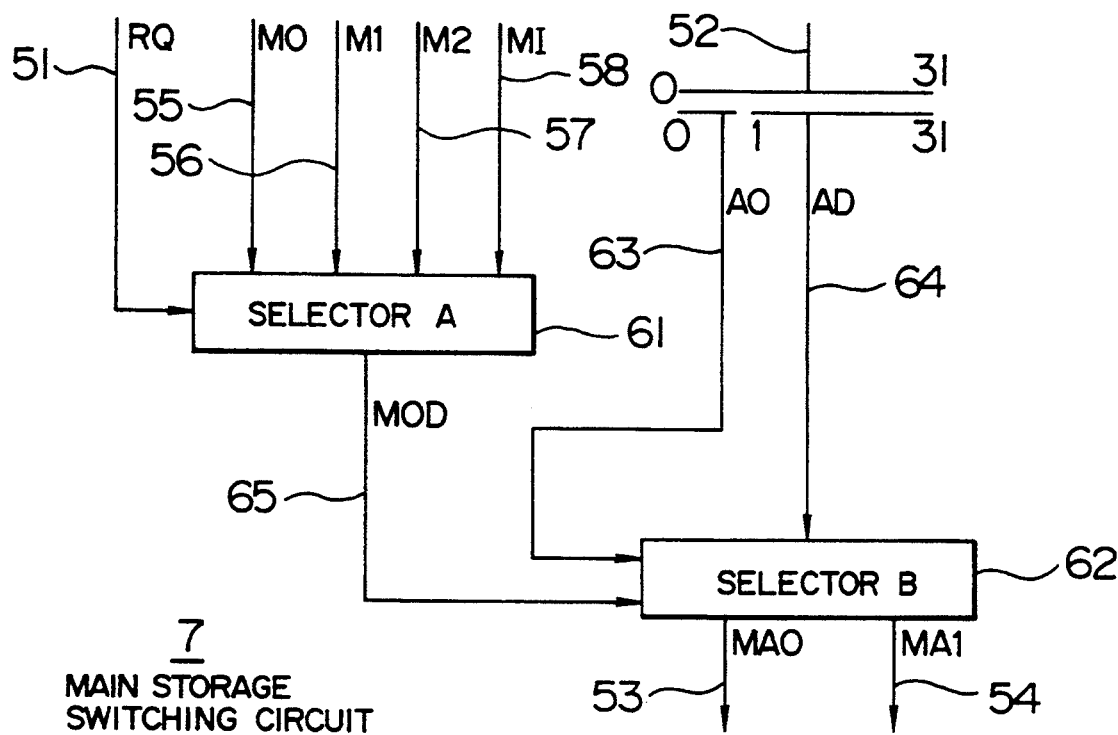

| REQUESTER FOR ACCESS | RQ | MOD |
|---|---|---|
| SVP | 0 | 0 |
| IOP | 1 | MI |
| IPO | 2 | MO |
| IP1 | 3 | M1 |
| IP2 | 4 | M2 |

| MOD | AO | OUTPUT | OUTPUT DESTINATION |
|---|---|---|---|
| 0 | 0 | MA0 | MS0 |
| 0 | 1 | MA1 | MS1 |
| 1 | 0 | MA0 | MS0 |
| 1 | 1 | MA0 | MS0 |
| 2 | 0 | MA1 | MS1 |
| 2 | 1 | MA1 | MS1 |
| 3 | 0 | MA1 | MS1 |
| 3 | 1 | MA0 | MS0 |

SIGP INSTRUCTION

HOT STAND-BY METHOD AND COMPUTER SYSTEM FOR IMPLEMENTING HOT STAND-BY METHOD

BACKGROUND OF THE INVENTION

The present invention relates to a hot stand-by method and a computer system for implementing the hot stand-by method which are preferably adapted to improve reliability about software fault.

The hot stand-by method is a method by which a spared device is kept in a hot state by way of precaution for fault occurrence in a computer system. This method is, in general, employed as a method for enhancing a fault-tolerant characteristic of a computer system.

As a representative prior art, a well known hot stand-by method is a disclosed in "Architecture of Fault-Tolerant Computers", IEEE COMPUTER, Vol. 17, No. 8 (August 1984), pp. 9–17 (First Prior Art). This first prior art is designed including two systems each having a central processing unit, a main storage unit, and an I/O processor one of the systems is prepared for normal use and the other for stand-by use. The first prior art operates such that the normal system performs the requested processing and the stand-by system succeeds to the processing if some fault takes place in the hardware or software included in the normal system. In the first prior art, the two systems include corresponding hardwares, each of which has a program pre-loaded thereon. Hence, whether fault takes place in the hardware or software, the normal-use system is switched to the stand-by system in the same routine without having to load the program. The resources such as data required for the succeeded processing are, however, stored in the same secondary storage unit such as a magnetic disk unit and shared in both normal and stand-by systems by connecting an I/O channel to the secondary storage unit to each of the systems.

As another representative prior art, is disclosed in JP-A-57-111900 (second prior art). This second prior art is designed so that two main storage units each pre-loading a program are prepared for normal use and stand-by use. The prior art takes the steps of, in the normal condition, writing data from a central processing unit and an I/O channel to both of the main storage units, if fault takes place in the hardware of the normal main storage unit, separating the normal main storage unit from the central processing unit, and having access to the stand-by main storage unit only for keeping the processing. The secondary storage units such as a magnetic disk unit are shared by both of the main storage units so that those storage units are connected to the main storage units through the I/O channels.

The first prior art providing two systems is advantageously capable of overcoming fault occurring in both of the hardware and software and operating the stand-by system without having to wait for new loading of a program. However, the first prior art is disadvantageous in light of the cost, since the art has double hardwares. The double hardwares are meaningless to the fault occurring on the software, which accepts for almost all of the actually-occurring faults. Further, in this prior art, the stand-by system cannot directly access the main storage unit included in the normal system. For fault analysis, this prior art has to take the steps of loading a program in a dump-dedicated system included in the normal system, dumping the content of the main storage unit of the normal system into the secondary storage unit, loading a program in the normal system again and analyzing the dumped data or staring up the stand-by system and analyzing the dumped data. In case the system includes a large-volume main storage, a considerably long time is needed for dumping the data, thereby for the fault analysis.

On the other hand, the second prior art providing two main storage units is less costly than the first prior art providing two overall systems but is not capable of overcoming software fault properly. That is, the second prior art is designed so that the data is written in both of the normal-use and stand-by main storage units. In case, therefore, the software contains such a bug as breaking the data on the main storage unit (that is, software fault), the data or program stored in the stand-by main storage unit may be broken down, thereby making it practically impossible to succeed to the processing using the stand-by main storage unit. Further, the prior art discloses nothing about fault analysis.

SUMMARY OF THE INVENTION

It is an object of the present invention to provide an inexpensive hot stand-by method which is capable of quickly performing a program without having to load a program and a computer system which is capable of reducing a time needed for fault analysis.

It is another object of the present invention to provide a fault analyzing method which is capable of analyzing fault for a short time and a computer system for implementing the fault analyzing method.

In carrying out the objects in a preferred mode, the computer system according to the present invention provides a processing unit and normal-use and stand-by main storage units, pre-loads an application program and a control program required for executing the application program in both of the main storage units, in a normal operating time, functions the normal-use main storage unit only as the main storage under the control of the processing unit, executes the control program and the application program stored in the normal-use main storage unit, in a software-fault occurring time, functions the stand-by main storage unit only as the main storage unit under the control of the processing unit, and executes the control program and the application program stored in the stand-by main storage unit. Then, a recovery program contained in the application program stored in the stand-by main storage unit serves to recover the state of the application program into the state before fault occurs. Next, the application program is kept executing or re-started from the head of the application program.

A hot stand-by method according to the present invention provides a stand-by main storage unit only. It results in making it possible to realize fault-tolerance to the software fault with a small cost.

In the normal operating condition, only the normal-use main storage is functioned as a main storage unit to the processing unit. No data is, therefore, written in the stand-by main storage unit. It results in preventing the program and the data stored in the stand-by main storage unit from being broken based on the software fault, which has been disclosed in the foregoing second prior art.

Further, for protecting the main storage unit from the software fault, a mechanism for address translation (not shown) includes a function for setting a write-inhibit to

BRIEF DESCRIPTION OF THE DRAWINGS

FIG. 2 is a diagram showing a main storage switching circuit;

FIG. 3 is a view showing correspondence between values and contents of a mode register MR;

DESCRIPTION OF PREFERRED EMBODIMENTS

Figure 1:
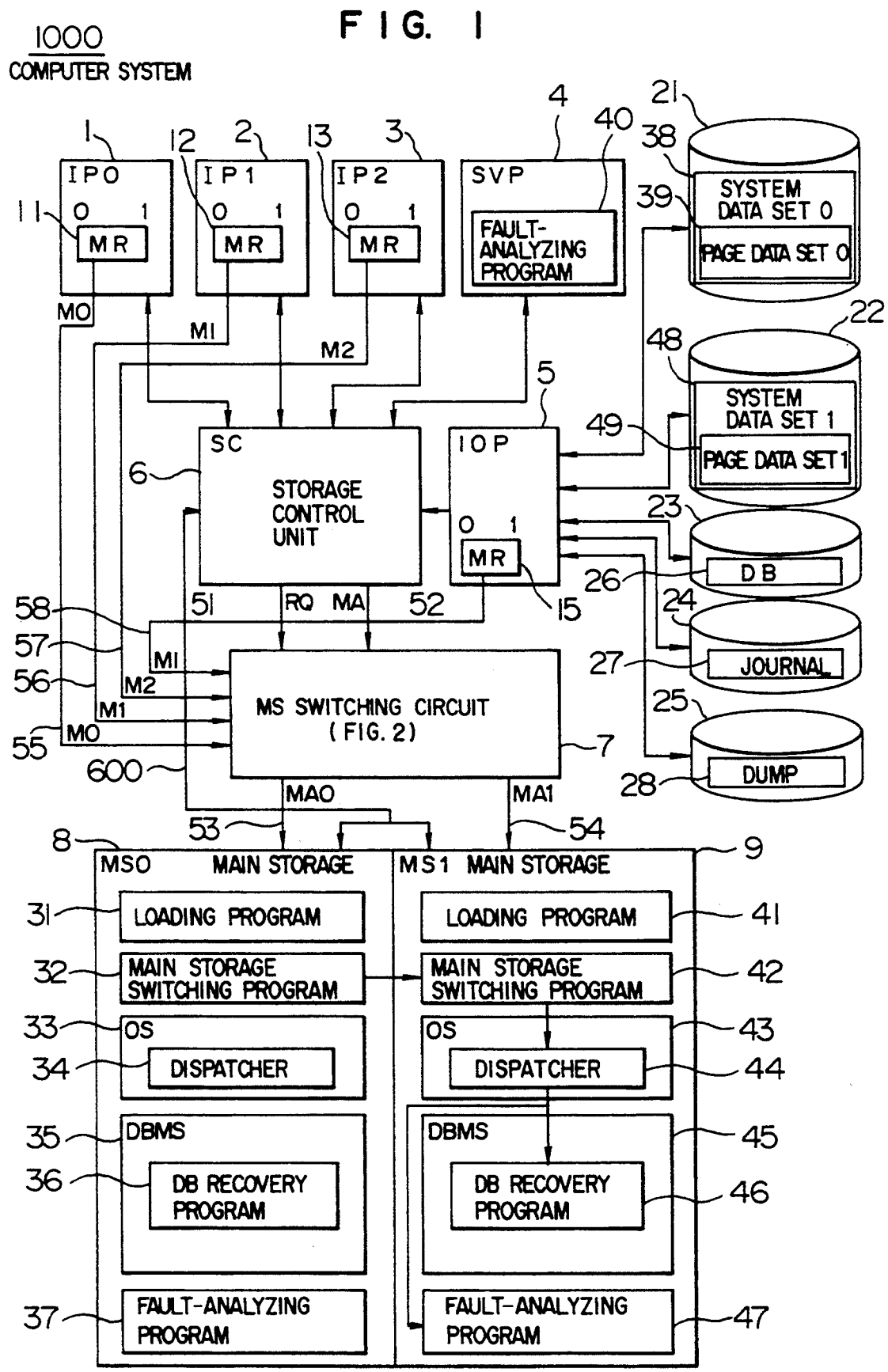
FIG. 1 is a block diagram showing a computer system according to an embodiment of the present invention.

Hereafter, the present invention will be discussed in detail along the embodiments illustrated in the drawings. The embodiments do not define the present invention.

According to the present embodiment, the computer system employs a normal demand paging virtual storage system. The main storage to be used through a program is a virtual storage. The content of the virtual storage overflown from the main storage is saved in a page data set, which is a kind of a system data set loaded on a secondary storage unit. The address on the main storage unit corresponds to the real-storage address given as a result of address-translating the virtual storage address.

The hardware of a computer system 1000 according to the present embodiment, as shown in FIG. 1, includes three instruction processors IP0(1), IP1(2), IP2(3) for executing an instruction, an I/O processor IOP(5) for executing an I/O, a service processor SVP(4) for manipulating and monitoring the system, two main storage units MS0(8), MS1(9), a storage control unit SC(6) for controlling access to the main storage units MS0(8), MS1(9), a main storage switching circuit (7), and secondary storage units (21), (22), (23), (24) like a magnetic disk unit. The instruction processors IP0(1), IP1(2), IP2(3) and the I/O processor IOP (5) provides two-bit mode registers MR (11), (12), (13), (15) for holding the address-corresponding information for the main storage units MS0(8) and MS1(9).

The main storage switching circuit (7), as shown in FIG. 2, is composed of selectors A (61) and B (62).

The software used in the present embodiment, as shown in FIG. 1, includes operating systems OS (33) and (43) loaded on the two main storage units MS0(8) and MS1(9), database management systems DBMS (35) and (45), loading programs (31) and (41), main storage switching programs (32) and (42), fault-analyzing programs (37) and (47), and a fault-analyzing program (40) loaded on the service processor SVP(4). Of those programs, the fault-analyzing programs (37) and (47) are loaded if they are required to be executed. The other programs are loaded in the main storage units MS0 and MS1 in advance. Further, the database management systems DBMS (35) and (45) correspond to a application program and the other programs correspond to a control program.

The read address used in the present computer system consists of 32 bits (bit 0 to 31). The main storage units MS0 and MS1 each has a large storage capacity ($2^{30}$ bits) determined by a 31-bit address. As will be described later, the read-storage address required by the programs except the fault-analyzing program has the most significant bit limited to 0 (bit 0 in the present embodiment). The programs except the fault-analyzing program use only either one of the main storage units MS0 and MS1 for execution. The fault-analyzing programs (37) and (47) use both of the main storage units MS0 and MS1 for execution.

FIG. 3 is a view showing correspondence between the values (address-corresponding information) set at the mode registers MR (11), (12), (13), (15) and the contents for the values.

If the mode register MR has a value of 1, only the main storage unit MS0(8) is to be accessed. The read-storage address in the range of less than $2^{31}$ corresponds to the main storage unit MS0(8). This mode is used when only the main storage unit MS0 is used as a normal-use main storage unit for executing the programs except the fault-analyzing programs, for example, in the normal operating time.

If the mode register MR has a value of 2, only the main storage unit MS1(9) is to be accessed. The read-storage address in the range of less than $2^{31}$ corresponds to the main storage unit MS1(9). This mode is used when only the main storage unit MS1 is used in place of the main storage unit MS0 for executing the programs except the fault-analyzing programs, for example, if software fault takes place.

If the mode register has a value of 0, both of the main storage units MS0(8) and MS1(9) are to be accessed. The read-storage address in the range of less than $2^{31}$ corresponds to the main storage MS0(8). The read-storage address in the range of $2^{31}$ or more corresponds to the main storage unit MS1(9). That is, if the bit 0 of the read-storage address is 0, the read address corresponds to the main storage unit MS0(8) and if the bit 0 of the read-storage address is 1, the read address corresponds to the main storage MS0(9). This mode is used when the fault-analyzing program (47) reads out the content of the main storage unit MS0 for analyzing the fault in the state that the main storage unit MS0 used for normal used is switched into the main storage unit MS1 by the software fault.

If the mode register MR has a value of 3, both of the main storage units MS0(8) and MS1(9) are to be accessed. The read-storage address in the range of less than $2^{31}$ corresponds to the main storage unit MS1(9) and the read-storage address in the range of $2^{31}$ or more corresponds to the main storage unit MS0(8). That is, if the bit 0 of the read-storage address is 0, the read-storage address corresponds to the main storage unit MS1(9) and if the bit 0 of the read-storage address is 1, the read-storage address corresponds to the main storage unit MS0(8). This mode is used for the fault-analyzing program (37) unlike the mode register MR having a value of 0.

Figures 4, 5:
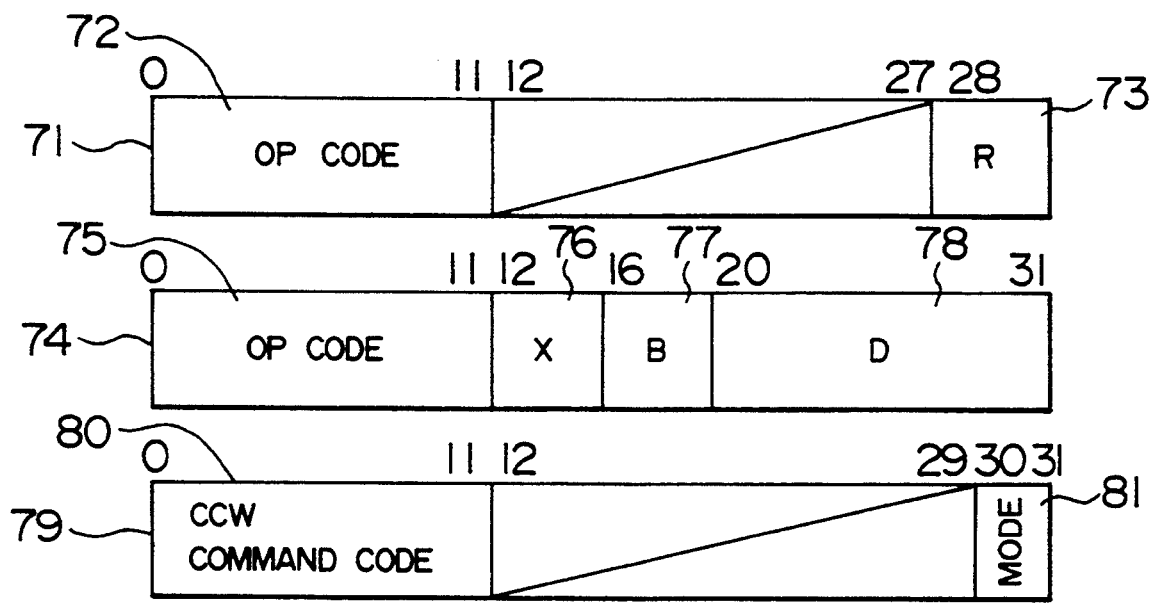
FIG. 4 is a format view showing an instruction for setting a value to a mode register and an I/O processor command.
FIG. 5 is a view showing the operation-correspondence of a selector A.

For setting the value to the mode registers MR (11), (12), (13), (15), the instructions (71) and (74) to be executed in a privilege state shown in FIG. 4 and an I/O processor command (79) are used. It will be discussed later in detail.

The instruction (71) is used for writing the content of the least significant 2 bits of a general-purpose register R specified by a field (73) to the mode register MR (11), (12) or (13).

The instruction (74) is used for writing to the mode register MR (11), (12) or (13) the content of the less significant 2 bits of a virtual-storage address byte, which is a result of adding the contents of two general-purpose registers X and B specified by fields (76) and (77).

The I/O processor command (79) is used for writing the content of a field 81 to the mode register MR(15).

The instructions (71) and (74) and the I/O processor command (79) respectively have longer operation code than a normal instruction so that they are prevented from being erroneously issued when a program runs away.

Those instructions (71) and (74) and the I/O processor command (79) are executed in the similar manner to the conventional register setting instruction. How to use those instructions and command will be discussed later in detail.

When the instruction processors IP0(1), IP1(2), IP2(3), the I/O processor IOP(5), or the service processor SVP(4) issues to the storage control unit SC(6) a request for accessing to the main storage unit, the storage control unit SC(6) serves to output a value 2, a value 3, a value 4, a value 1 or a value 0 as an address-corresponding signal RQ according to each access requester to the main storage switching circuit (7) through a signal line (51). The storage control unit SC(6) also serves to output a read-storage address MA to the main storage switching circuit through a signal line (52).

In the main switching circuit (7), as shown in FIG. 2, the selector A (61) follows the operation-corresponding view of FIG. 5 based on a value of the address-corresponding signal RQ. The content M0, M1, M2 or M1 or the value of 0 of the mode register MR for the access requester is outputted as a signal MOD to a selector B 62 through a signal line 65.

Figures 6, 7:
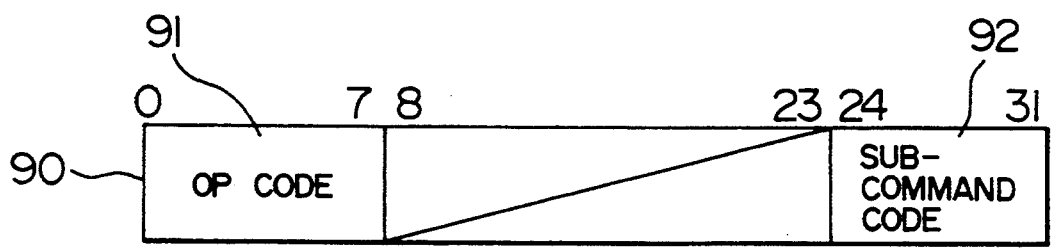
FIG. 6 is a view showing the operation-correspondence of a selector B.
FIG. 7 is a format view showing a signal processor instruction.

The selector B (62) follows the operation-corresponding view of FIG. 6 based on the signal MOD and the bit 0 (signal A0) of the read-storage address signal MA. As shown in FIG. 6, the selector B (62) serves to output the bits 1 to 31 (signal AD) of the read-storage address signal MA as the address signal MA0 or MA1. The address signal MA0 is outputted to the main storage unit MS0(8) and the address signal MA1 is outputted to the main storage unit MS1(9). The main storage unit MS0 or MS1 is connected to the main storage unit (6) through a data transfer bus (600).

FIG. 7 shows a SIGP instruction (90) of a signal processor for synchronizing the instruction processors. The SIGP instruction (90) has a function of causing an interrupt in the specified instruction processor and notifying the processor of a sub-command code (92).

Figure 8:
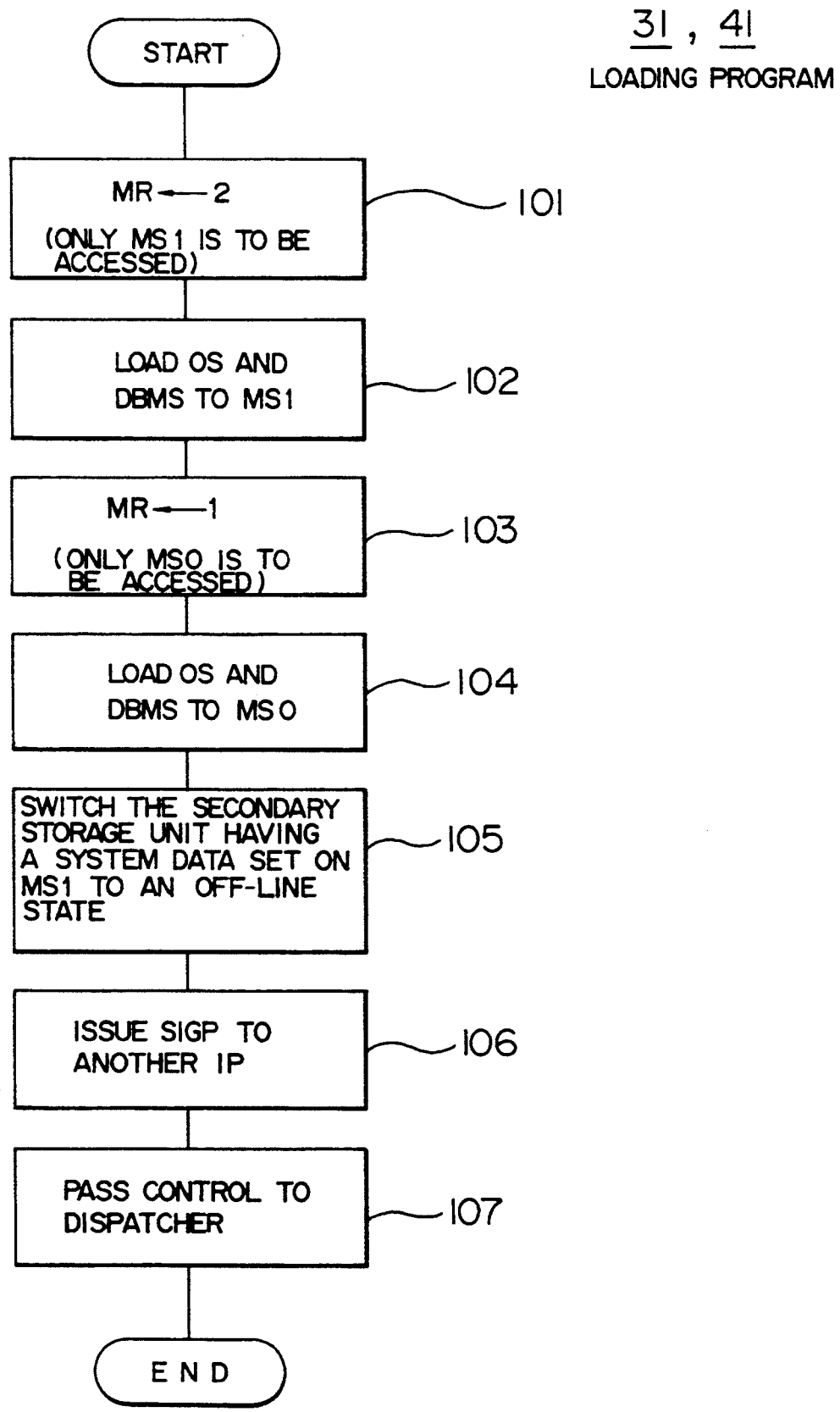
FIG. 8 is a flowchart showing a loading program.

Then, the description will be directed to the operation of the loading programs (31) and (41) with reference to FIG. 8.

Assuming that the main storage unit MS0 is for normal use and the main storage unit MS1 is for stand-by use, the loading programs (31) and (41) are loaded from a system data set 0 (38) stored in the secondary storage unit (21) to the predetermined same address areas of the main storage unit MS0(8) and the MS1(9) through the effect of a specific instruction processor, for example, IP0(1) in response to a specification of an operator from the service processor SVP(4) at the starting time of processing. Then, the loading programs (31) and (41) are executed by the instruction processor IP0. Assuming that the mode register MR of the instruction processor IP0 has an initial value of 0, the loading program stored in the main storage unit MS0 is executed.

At a step 101, a value of 2 is set to the mode register MR(11) of the instruction processor IP0(1) so that the only the main storage unit MS1(9) is to be accessed. Hence, the subsequent part of the loading program 41 stored in the main storage unit MS1 is executed. Since the loading programs (31) and (41) are stored in the same address areas of the main storage unit MS0 and MS1 as stated above, if the loading program (31) is switched to the loading program (41) or vice versa, the subsequent part of the switched loading program is allowed to be executed in placed of the original loading program.

At a step 102, the operating system OS(43), the database management system DBMS(45), the main storage switching program (42), and the fault-analyzing program (47) are loaded from the system data set 1(48) stored in the secondary storage unit 22 to the main storage unit MS1(9).

At a step 103, a value of 1 is set to the mode register MR(11) of the instruction processor IP0(1) so that the only the main storage unit MS0(8) is to be accessed. It results in allowing the subsequent part of the loading program (31) to be executed.

At a step 104, based on the system data set 0(38), the operating system OS(33), the database management system DMBS(35), the main storage switching program (32), and the fault-analyzing program (37) are loaded from the system data set 0(38) stored in the secondary storage unit (22) to the main storage unit MS0(8).

After loading, the virtual storage area of the main storage switching program (32) is set to a write-inhibit state through the effect of the write-inhibit function of the address translation mechanism (not shown). With this setting, if software fault takes place in the operating system or the application program, this setting may reduce breakdown of the loading program to a quite little.

At a step 105, the secondary storage unit (22) storing the system data set 1(48) to be sent to the main storage unit MS1(9) is switched to an off-line state to the operating system OS(33).

At a step 106, for setting a value of 1 to the mode register MR(12) of the instruction processor IP1(2) and the mode register MR(13) of the instruction processor IP2(3), the instruction processor IP0 issues the SIGP instruction having a sub-command code to the instruction processors IP1(2) and IP2(3). Each of the instruction processors IP1 and IP2 includes a circuit (not shown) for setting a value of the mode register MR included in it to 1 in response to the SIGP instruction. It results in allowing these instruction processors IP1 and IP2 to access only the main storage unit MS1.

At a step 107, control is passed to a dispatcher (34) of the operating system OS(33). The dispatcher (34) serves to start the application program 35 stored in the main storage unit MS0 on a proper timing basis. The application program 35 is composed of two or more tasks, each of which is dispatched to any one of the instruction processors by the dispatcher (34) and is executed in the corresponding instruction processor. Upon execution of the application program (35), a journal (27) concerned with the execution history of the application program (35) is outputted to the auxiliary storage unit (25). Also, upon execution of the application program (35), the known method is employed in which the virtual-storage address is translated into the read-storage address by the instruction processor with reference to the address translation table (not shown) stored in the main storage unit MS0. During execution of this method, paging of the main storage unit MS0 is carried out through the effect of the page data set (39) stored in the auxiliary storage unit (21).

In the foregoing process, the main storage switching programs (32) and (42) are loaded to the same address areas of the main storage units MS0(8) and MS0(9) on the same ground that the initial programs (31) and (41) are loaded on the same address areas of the main storage units MS0(8) and MS1(9).

Figure 9:
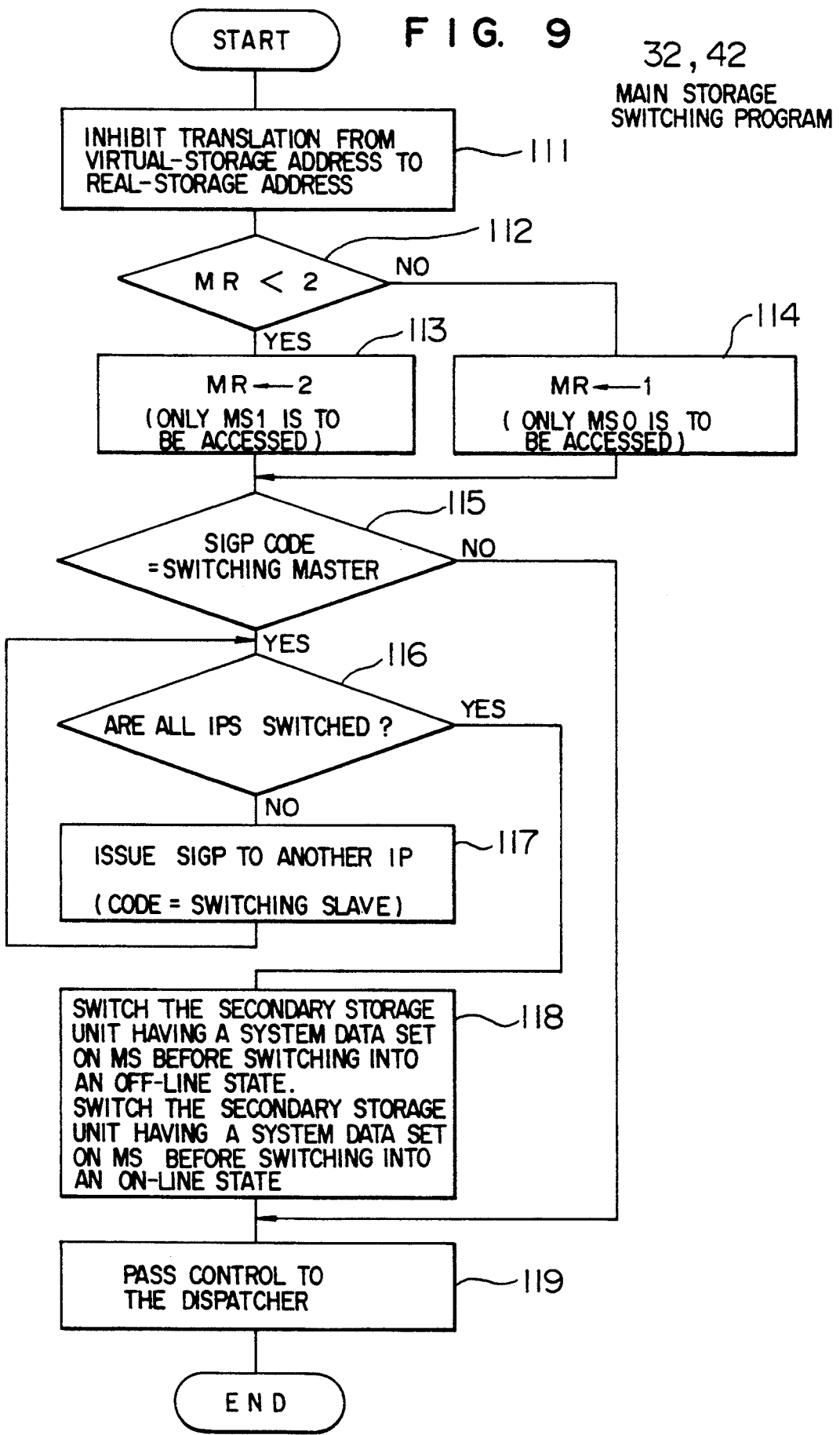
FIG. 9 is a flowchart showing a main storage switching program.

With reference to FIG. 9, the description will be directed to the operation of the main storage switching program (32) as taking an example of switching the main storage unit MS0(8) to MS1(9). The main storage switching program (42) functions in the similar manner.

A first type SIGP instruction having a "main storage switching master" code (to be described later) specified therein is issued to a specific processor, for example, IP0 from the operating system OS(33) if fault occurrence is detected in the software or the hardware of the main storage unit or from the service processor SVP in response to an operator's instruction if the operator determines fault takes place in the software or the hardware. In response to this SIGP instruction, the main storage switching program (32) is started and executed by the instruction processor IP0. According to the present embodiment, initially, the instruction processor IP0 having executed the main storage switching program (32) serves to switch the value of the mode register MR(11) so that the stand-by main storage unit MS1 is to be accessed by the instruction processor IP0. The instruction processor serves to issue a second type SIGP instruction having a "main storage switching slave" code specified therein to the other instruction processors IP1(2) and IP2(3). The main storage switching program (32) is also executed by these instruction processors IP1 and IP2. At a time, these instruction processors IP1 and IP2 serve to rewrite the mode registers IP1 and IP2 included therein. In either case of the software fault or hardware fault of the main storage unit, the same switching process is performed.

At first, the main storage switching program (32) stored in the main storage unit MS0 for normal use is executed. That is, at a step 111, the address translation is inhibited from the virtual-storage address to the read-storage address by considering that the address translation table (not shown) on the main storage unit MS0(8) may be broken down. That is, at this time, the instruction processor (IP0 in this embodiment) being executing the main storage switching program (32) serves to switch its own main storage address translation mode into the read-storage address mode with the known method. It results in allowing the subsequent part of the main storage switching program (32) to specify the read-storage address.

At a step 112, it is checked whether or not the value of the mode register MR(11) is smaller than a value of 2. This is a step for determining whether the current main storage unit is MS0 or MS1. If the current main storage unit is MS0(8), the mode register MR(11) has a value of 1. That is, since it is smaller than 2, the process goes to a step 113. If, on the other hand, the current main storage unit is MS1(9), the mode register MR(11) has a value of 2. Since it is not smaller than 2, the process goes to a step 114. Since the current main storage unit is assumed as MS0 in this embodiment, the process goes to the step 113.

At the step 113, a value of 2 is set to the mode register MR (11 in this embodiment) included in the instruction processor (IP0 in this embodiment) executing the main storage switching program (32). It means that the main storage unit is switched from MS0(8) to MS1(9). Hence, the subsequent processing is executed by the subsequent part of the main storage switching program (42).

In case the process goes to the step 114, a value of 1 is set to the mode register MR(11). It means that the main storage unit is switched from MS1(9) to MS0(8).

According to the present embodiment, the processing of the main storage switching program (32) or (34) done by the instruction processor IP0 at the initial time is different from the processing done by another instruction processor during the execution time in response to an indication sent from the instruction processor. Hence, at a step 115 after the step 113, the main storage switching program (32) or (42) under the current execution serves to check whether or not the instruction processor receiving the first type SIGP instruction (SIGP instruction having a main storage switching master code specified therein) is executed. If yes, the process goes to a step 116. If not, the process goes to a step 119. According to the present embodiment, the main storage switching program (32) is assumed to be initially started by the instruction processor IP0. Hence, after the determination at the step 115, the process goes to a step 116. At a step 117 (described later), when the other instruction processor IP1 or IP2 is executing the main storage switching program, the process goes to a step 119.

At the step 116, it is checked whether or not the main storage switching is indicated to all the other instruction processors IP1(2) and IP2(3), that is, the second type SIGP instruction is issued to those instruction processors. If yes, the process goes to a step 118. If no, the process goes to a step 117.

At the step 117, the second type SIGP instruction (SIGP instruction having a main storage switching slave code specified therein) is issued to the other instruction processors IP1(2) and IP2(3). In these instruction processors, an interrupt takes place, thereby executing the main storage switching program (32) or (42). As a result, the steps 111 to 114 are carried out, resulting in switching the values of the mode registers MR(12) and (13) included in the instruction processors.

At the step 118, the secondary storage unit (21) having the system data set 0(38) used by the operating system OS(33) before the main storage switching is done is switched to an off-line state to the operating system OS(43). The secondary storage unit (22) having the system data set 1(48) is switched to an on-line state to the operating system OS(43). The secondary storage units (23) and (24) storing the data of the database management system DBMS (45) are switched to an on line, because they are used for the processing after the main storage switching is done.

At a step 119, control is passed to the dispatcher (44) of the operating system OS(43) for succeeding to the operation of the system. When a new program is dispatched to any one of the instruction processors by the dispatcher (44), the address translation modes of these instruction processors are returned to the address translation mode at which the virtual-storage address is translated into a read-storage address. It results in terminating the main storage switching.

Then, the service processor SVP serves to put the recovery program (DB recovery program (46) in this embodiment) included in the application program (32) under the control of the dispatcher in response to an operator's indication. And, when the DB recovery program (46) is started by the dispatcher, by inputting the database DB (26) and the journal (27), the DB recovery program (46) serves to recover the states of the database management system DBMS (45) and the database DB (26) into the well-matched state immediately before fault takes place in the database management system DBMS(35). Then, from the state, the execution of the application program (45) is re-started. The recovering processing done in the DB recovery program (46) is a well-known technique.

As stated above, after the main storage unit is switched from MS0 to MS1, the application program (45) is allowed to be executed and re-started on the middle process. Then, with reference to FIG. 10, the description will be directed to the fault-analyzing program (47). The fault-analyzing program (37) functions in the similar manner.

After re-starting the execution of the DBMC program during the re-starting time, the operator indicates to put the fault-analyzing program (47) as a job of the privilege state under the control of the dispatcher (44). Then, the program (47) is dispatched to any one of the instruction processors in which it is executed.

The fault-analyzing program (47) uses both of the main storage units MS0 and MS1 as a main storage unit. In case the main storage unit MS1 is for normal use, the main storage unit MS1 is used as the lower-rank address area (where the most significant bit (bit 0) is zero). The main storage unit MS0 is used as the upper-rank address area (bit 0 is 1). The instruction processor IP0 is assumed to execute the fault-analyzing program (47).

At a step 131, it is determined whether or not the main storage unit MS0 or MS1 uses the fault-analyzing program. Herein, it is checked whether or not the value of the mode register MR (11, for example) of the instruction processor executing the program (47) is smaller than a value of 2. If the current main storage unit is MS0(8), the value of this mode register MR(11, for example) is 1. Hence, since it is smaller than 2, the process goes to a step 132. If, on the other hand, the current main storage is MS1(9), the value of the mode register MR (11, for example) is 2. Since it is not smaller than 2, the process goes to a step 133. In this embodiment, since the main storage unit MS1 is not currently used, the process goes to a step 133.

At the step 133, a value of 3 is set to this mode register MR(11, for example). It means that if the bit 0 of the read-storage address required by the program is "0", only the main storage unit MS1 (9) is to be accessed and if the bit 0 is "1", only the main storage unit MS0(8) is to be accessed.

The process at the step 132 is executed when the main storage unit MS0 is currently used. Herein, a value of 0 is set to the mode register (11, for example). If the bit 0 of the read-storage address is "0", only the main storage unit MS0(8) is to be accessed. If the bit 0 is "1", only the main storage unit MS1(9) is to be accessed.

Next, at a step 134, the secondary storage unit on the fault-occurring system, that is, the secondary storage unit (21) having the system data set 0 on the main storage unit before being switched (MS0(8) in this embodiment) is switched to an on-line state.

At the step 135, the cause and situation of fault are analyzed in light of the content of the main storage unit on the fault-occurring system, in particular, various tables of the OS and the page data set, that is, the contents of the MS0(8) and the page data set 1(39). That is, the fault-analyzing operation makes it possible to directly access the normal-use main storage unit, MS0 in this embodiment, before the fault occurrence, thereby analyzing the fault rapidly.

After finishing the analysis, the following processing is executed before termination of the program execution. At first, the secondary storage unit on the fault-occurring system, that is, the secondary storage unit (21) is switched to an off-line state. Next, it is necessary to rewrite a value of the mode register of the instruction processor (IP0 in this embodiment) currently executing the fault-analyzing program (47) so that only the currently-used main storage unit (MS1 in this embodiment) is to be accessed. For the purpose, at a step 137, it is checked whether or not the mode register MR (11) has a value of 0. If the currently-used main storage unit is MS0(8), the mode register MR(11) has a value of 0. The process goes to a step 138. If, on the other hand, the currently-used main storage unit is MS1(9), the mode register MR(11) has a value of 3. Since it is not 0, the process goes to a step 139.

At the step 139, a value of 2 is set to the mode register MR(11). It means that only the main storage unit MS1(9) is to be accessed.

If the process goes to a step 138, a value of 1 is set to the mode register MR(11). It means that only the main storage unit MS0(8) is to be accessed.

As a result, the fault-analyzing program (47) is terminated. The instruction processor IP0 is returned to the state in which any task of the DBMS program (45) is allowed to be executed.

When the instruction processor IP0(1), IP1(2) or IP2(3) executes the fault analysis, the instruction processor is unable to execute the task of the DBMS program (45). To avoid the inability, the fault-analyzing program (40) is loaded in the service processor SVP(4) in advance and is executed therein.

Figure 10:
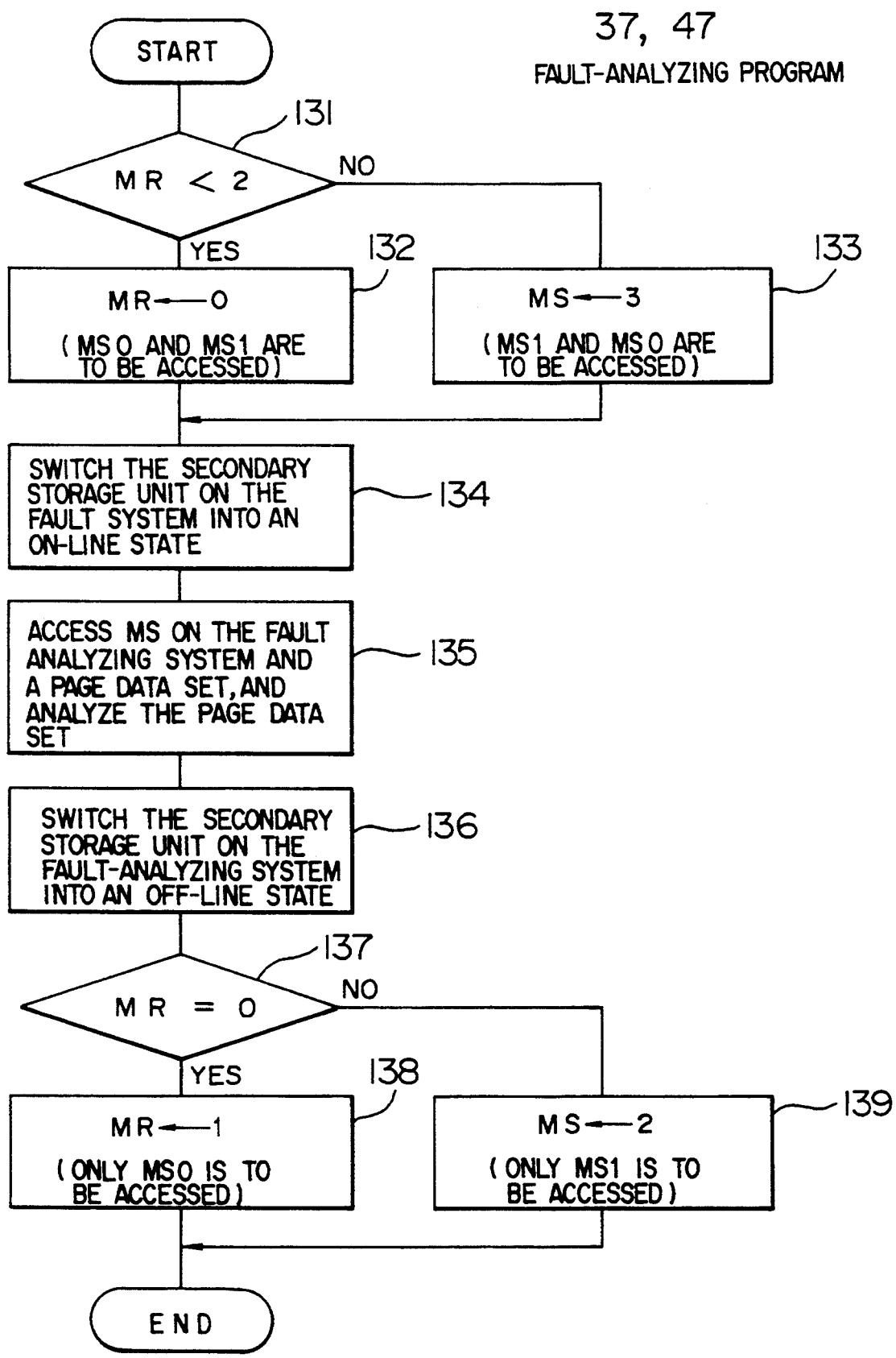
FIG. 10 is a flowchart showing a fault-analysis program.

The processing content of the fault-analyzing program (40) is substantially same as that of the fault-analyzing processing program (37) or (47), except the steps 131 to 133 and 137 to 139 are excluded from the flowchart shown in FIG. 10, because the service processor (4) is allowed to access both of the main storage unit MS0(8) and MS1(9).

When the fault analysis terminates, the main storage unit MS0(8) is returned to a stand-by state, which is its normal mode, based on the following steps. That is, if fault results from the software error, the error-occurring program is repaired. If fault results from the failure of the main storage unit MS0, the main storage unit MS0 is repaired. Then, the system data set 0(38) is initialized and the normal operating system OS(33) and the normal database management program DBMS(35) are loaded to the main storage unit MS0(8). Afterward, if fault takes place in the system having the main storage unit MS1(9), the system having the main storage unit (8) can succeed to the processing in the similar manner.

Modifications (1) The foregoing fault-analyzing method disallows the main storage unit MS0(8) to be returned to the stand-by state until the fault analysis is terminated. In case it takes a long time to analyze the fault, the fault-tolerance against a new fault may be lowered only during the fault-analyzing time. Hence, if the subject processing needs fault-tolerance more than the rapid fault-analyzing, the following fault-analyzing method is effective. After the proceeding is succeeded from the main storage unit MS0(8) to the application program of the main storage unit through the effect of the main storage switching programs (32) and (33), the secondary storage unit (21) is switched to an off-line state and the content of the main storage unit MS0(8) and the page data set (39) stored in the secondary storage unit (21) are written to the dump data set (28) of the secondary storage unit (25) so that the main storage unit MS0(8) is returned to the stand-by state. Then, the system having the main storage unit MS1(9) currently executing the processing reads the content of the dump data set (28) for analyzing the fault. The method for analyzing the fault on such a dump data set (28) is a well-known technique.

(2) The application program used in the foregoing embodiment includes a recovery program in itself. With the recovery program, it is possible to re-execute the application program from the state immediately before the fault takes place. However, for the application program having no recovery program, like TSS, the main storage unit is switched and the application program is put under the control of the dispatcher so that the application program is re-executed from the head.

According to the hot stand-by method of the present invention, what is required is only the main storage unit for a stand-by use. It is thus possible to realize the fault-tolerance against the software fault and the hardware fault at low cost.

If software fault takes place, no data is broken in the stand-by main storage unit. Hence, it is possible to load the application program on the stand-by main storage unit in advance, resulting in being able to rapid succeeding of the processing if fault takes place.

Moreover, direct access from the central processing unit for executing the fault-analyzing program or the service processor to the normal-use main storage unit is made possible. Hence, it is unnecessary to dump the content of the main storage unit to the secondary storage unit, resulting in allowing the fault analysis to be executed for a short time.

What is claimed is:

1. A hot stand-by method implemented in a computer system having a processing unit, normal-use and stand-by main storage units each connected to said processing unit, and an auxiliary storage unit for holding a journal and being connected to said processing unit, comprising the steps of:

loading a same application program to be executed and a same control program required for executing the application program to said normal-use main storage unit as normal-use control and application programs and to said stand-by main storage unit as stand-by control and application programs;

executing, by said processing unit, said normal-use control program and said normal-use application program loaded in said normal-use main storage unit, said normal-use control program and said normal-use application program serving to inhibit access to said stand-by main storage unit during execution thereof by said processing unit;

storing a journal concerned with an execution history of said normal-use application program in said auxiliary storage unit;

interrupting execution of said normal-use control program and said normal-use application program when a fault occurs in either one of said normal-use control program or said normal-use application program being executed; and executing, by said processing unit, said stand-by control program and said stand-by application program loaded in said stand-by main storage unit, executing a fault-recovery program containing said stand-by application program by using the journal stored in said auxiliary storage unit for recovering the state of the stand-by application program to the state of said normal-use application program before said fault occurred, and executing the stand-by application program from the recovered programming state.

2. A hot stand-by method according to claim 1, wherein said computer system further includes a normal-use auxiliary storage unit and a stand-by auxiliary storage unit for holding a page data set;

said normal-use application program is executed by using the page data set held in said normal-use auxiliary storage unit; and said stand-by application program is executed by using the page data set held in said stand-by auxiliary storage unit.

3. A hot stand-by method implemented in a computer system having a processing unit and normal-use and stand-by main storage units each connected to said processing unit, comprising the steps of:

loading a same application program to be executed and a same control program required for executing the application program to said normal-use main storage unit as normal-use control and application programs and to said stand-by main storage unit as stand-by control and application programs;

executing, by said processing unit, said normal-use control program and said normal use-application program loaded in said normal-use main storage unit, said normal-use control program and said normal-use application program serving to inhibit access to said stand-by main storage unit during execution by said processing unit;

interrupting execution of said normal-use control program and said normal-use application program when a fault occurs in either one of said normal-use control program and said normal-use application program being executed; and executing in said processing unit said stand-by application program loaded in said stand-by main storage unit under the control of said stand-by control program loaded in said stand-by main storage unit.

4. A hot stand-by method according to claim 3, wherein said computer system further includes a normal-use auxiliary storage unit and a stand-by auxiliary storage unit for holding a page data set respectively;

said normal-use application program is executed by the page data set held in said normal-use auxiliary storage unit; and said stand-by application program is executed by using said page data set held in said stand-by auxiliary storage unit.

5. A hot stand-by method implemented in a computer system having a processing unit, normal-use and stand-by main storage units each connected to said processing unit, and an auxiliary storage unit for holding a journal and being connected to said processing unit, comprising the steps of:

loading a same application program to be executed and a same control program required for executing the application program to said normal-use main storage unit as normal-use control and application programs and to said stand-by main storage unit as stand-by control and application programs;

executing, by said processing unit, said normal-use control program and said normal-use application program loaded in said normal-use main storage unit, said normal-use control program and said normal-use application program serving to inhibit access to said stand-by main storage unit during execution thereof by said processing unit;

storing a journal concerned with an execution history of said normal-use application program in said auxiliary storage unit;

interrupting execution of said normal-use control program and said normal-use application program when a fault occurs in said normal-use main storage unit during said execution; and executing, by said processing unit, said stand-by control program and said stand-by application program loaded in said stand-by main storage unit, executing a fault-recovery program containing said stand-by application program by using the journal stored in said auxiliary storage unit for recovering the state of the stand-by application program to the state of said normal-use application program before said fault occurred, and executing said stand-by application program from the recovered programming state.

6. A hot stand-by method implemented in a computer system having a processing unit, normal-use and stand-by main storage units each connected to said processing unit, comprising the steps of:

loading a same application program to be executed and a same control program required for executing the application program to said normal-use main storage unit as normal-use control and application programs and to said stand-by main storage unit as stand-by control and application programs;

executing, by said processing unit, said normal-use control program and said normal-use application program loaded in said normal-use main storage unit, said normal-use control program and said normal-use application program serving to inhibit access to said stand-by main storage unit during the execution thereof by said processing unit;

interrupting execution of said normal-use control program and said normal-use application program when a fault occurs in said normal-use main storage unit during said execution; and executing, by in said processing unit, said stand-by application program loaded in said stand-by main storage unit under the control of said stand-by control program loaded in said stand-by main storage unit.

7. A hot stand-by method implemented in a computer system having a processing unit and normal-use and stand-by main storage units each connected to said processing unit, comprising the steps of:

loading a same application program to be executed and a same control program required for executing said application program to said normal-use main storage unit as normal-use control and application programs and to said stand-by main storage unit as stand-by control and application programs, respectively;

executing, by said processing unit, said normal-use control program and said normal-use application program loaded in said normal-use main storage unit;

interrupting execution of said normal-use control program and said normal-use application program when a fault occurs in software or said main storage unit during execution; and loading in said processing unit said stand-by control program and said stand-by application program loaded in said stand-by main storage unit;

said loading a same application program and a same control program step comprising the steps of:

loading a loading program in an address area of said normal-use main storage unit, loading the same loading program as said loading program on a same address area as said address area in said stand-by main storage unit, executing part of a first loading program held in either one of said normal-use main storage unit or said stand-by main storage unit in said processing unit and loading said control program and application program in either one of said main storage units and executing by said processing unit the succeeding part of a same part as said part of said first loading program, said succeeding part being located in a second loading program held in the other one of said normal-use main storage unit and stand-by main storage unit, and loading said control program and application program in the other main storage unit.

8. A fault-analyzing method according to claim 1 comprising the steps of:

loading a fault-analyzing program in said stand-by main storage unit;

executing by said processing unit said fault-analyzing program under the control of said stand-by control program by using said normal-use and stand-by main storage units as the main storage unit together with the execution of said stand-by application program; and analyzing the fault in light of the content of said normal main storage unit, based on said fault-analyzing program.

9. A fault-analyzing method implemented in a computer system having a processing unit, normal-use main storage unit, and stand-by main storage unit each connected to said processing unit, comprising the steps of:

loading a same application program to be executed and a same control program required for executing said application program to said normal-use main storage unit as normal-use control and application programs and to said stand-by main storage unit as stand-by control and application programs, respectively;

executing, by said processing unit, said normal-use control program and said normal-use application program loaded in said normal-use main storage unit, and inhibiting accessing of said normal-use control program and said normal-use application program to said stand-by main storage unit;

interrupting execution of said normal-use control program and said normal-use application program when a fault occurs in software or said main storage unit during said execution;

executing, by said processing unit, said stand-by control program and said stand-by application program loaded in said stand-by main storage unit;

loading a fault-analyzing program in said stand-by main storage unit;

executing, by said processing unit, said fault-analyzing program under control of said stand-by control program by using said normal-use and stand-by main storage units together with execution of said stand-by application program; and analyzing a fault in light of the content of said normal-use main storage unit, based on said fault analyzing program.

10. A fault-analyzing method according to claim 9, wherein said computer system includes a normal-use auxiliary storage unit and a stand-by auxiliary unit for holding a page data set;

said method further comprising the steps of updating the page data set held in said normal-use auxiliary storage unit during execution of said normal-use application program; and updating a page data set held in said stand-by auxiliary storage unit during the execution of said stand-by application program;

wherein said fault-analysis is carried out on the page data set held in said normal-use main storage unit and normal-use auxiliary storage unit.

11. A fault-analyzing method according to claim 9, wherein said computer system includes a normal-use auxiliary storage unit and a stand-by auxiliary unit for holding a page data set and a fault-analyzing auxiliary storage unit;

said method further comprising the steps of updating the page data set held in said normal-use auxiliary storage unit during execution of said normal-use application program, updating a page data set held in said stand-by auxiliary storage unit during the execution of said stand-by application program; and writing the content of said normal-use main storage unit and the page data set held in said normal-use auxiliary storage unit as a dump data set in said fault-analyzing auxiliary storage unit;

wherein said fault-analysis is carried out on said written dump data set.

12. A fault-analyzing method according to claim 11, further comprising the steps of loading the control program and the application program having no fault to said normal-use main storage unit after terminating write of said dump data set and before terminating said fault analysis.

13. A fault-analyzing method according to claim 9, wherein the loading of said fault-analyzing program is carried out together with said stand-by control program and application program.

14. A fault-analyzing method implemented in a computer system having a processing unit, normal-use main storage unit, stand-by main storage unit, and a service processor, the latter three each being connected to said processing unit, comprising the steps of:

pre-loading a same application program to be executed and a same control program required for executing said application program to said normal-use main storage unit as normal-use application and control programs and to said stand-by main storage unit as stand-by control and application programs, respectively;

executing, by said processing unit, said normal-use control program and said normal-use application program loaded in said normal-use main storage unit, and inhibiting access of said normal-use control program and said normal-use application program to said stand-by main storage unit during said execution;

interrupting execution of said normal-use control program and said normal-use application program if a fault occurs in said computer system during said execution;

executing, by said processing unit, said stand-by control program and said stand-by application program loaded in said stand-by main storage unit;

executing, by said service processor, a fault-analyzing program held in said service processor by using said normal-use and stand-by main storage units together with execution of said stand-by application program; and analyzing the fault in light of the content of said normal-use main storage unit, based on said fault-analyzing program.

15. A computer system comprising:

a processing unit;

a normal-use main storage unit and a stand-by main storage unit each loading a same application program to be executed and a same control program required for executing said application program, said units each being connected to said processing unit; and means for connecting said normal-use main storage unit and said stand-by main storage unit to said processing unit so that said processing unit has access to only the normal-use main storage unit when the control program and the application program held in said normal-use main storage unit are executed and said processing unit makes access to only the stand-by main storage unit as a main storage unit when the control program and the application program held in said stand-by main storage unit are executed.

16. A computer system comprising:

a processing unit;

a normal-use main storage unit and a stand-by main storage unit each loading a same application program to be executed and a same control program required for executing said application program, said units each being connected to said processing unit; and means for connecting said normal-use main storage unit and said stand-by main storage unit to said processing unit so that said processing unit makes access to only the normal-use main storage unit when the control program and the application program held in said normal-use main storage unit are executed and said processing unit makes access to only the stand-by main storage unit as a main storage unit when the control program and the application program held in said stand-by main storage unit are executed;

wherein said stand-by main storage unit holds a fault-analyzing program using said normal-use main storage unit and said stand-by main storage unit as a main storage unit; and said connecting means includes means for connecting said processing unit to said normal-use main storage unit and said stand-by main storage unit so that said processing unit can make access to both of said normal-use main storage unit and said stand-by main storage unit.

17. A computer system according to claim 16, further comprising means for displaying any one of a first mode at which said processing unit can access to only said normal-use main storage unit, a second mode at which said processing unit can access to only said stand-by main storage unit, and a third mode at which said processing unit can access to said normal-use main storage unit and said stand-by main storage unit;

wherein said means is composed of a circuit serving to send a main storage unit address output from said processing unit to said normal-use main storage unit only or said stand-by main storage unit only at the first or second mode and send the main storage unit address outputted from said processing unit to said normal-use main storage unit or said stand-by main storage unit according to the address value.

* * * * *